(12) United States Patent
Yan et al.

(10) Patent No.: US 12,454,454 B2
(45) Date of Patent: Oct. 28, 2025

(54) ELECTRONIC DEVICE AND METHOD OF FABRICATING THE SAME

(71) Applicants: Beijing BOE Optoelectronics Technology Co., Ltd., Beijing (CN); BOE TECHNOLOGY GROUP CO., LTD., Beijing (CN)

(72) Inventors: Hao Yan, Beijing (CN); Yulin Feng, Beijing (CN); Yue Li, Beijing (CN); Chuncheng Che, Beijing (CN)

(73) Assignees: Beijing BOE Optoelectronics Technology Co., Ltd., Beijing (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/022,145

(22) PCT Filed: Mar. 31, 2022

(86) PCT No.: PCT/CN2022/084486
§ 371 (c)(1),
(2) Date: Feb. 18, 2023

(87) PCT Pub. No.: WO2023/184375
PCT Pub. Date: Oct. 5, 2023

(65) Prior Publication Data
US 2024/0270566 A1 Aug. 15, 2024

(51) Int. Cl.
*B81B 7/00* (2006.01)
*B81C 99/00* (2010.01)
(Continued)

(52) U.S. Cl.
CPC ............ *B81B 7/0006* (2013.01); *B81C 99/00* (2013.01); *H05K 1/0306* (2013.01); *H05K 1/115* (2013.01);
(Continued)

(58) Field of Classification Search
CPC ... B81B 2201/014; B81B 7/0006; B81B 7/00; H05K 1/0306; H05K 1/115; H05K 1/181;
(Continued)

(56) References Cited

U.S. PATENT DOCUMENTS

| 6,624,003 | B1 | 9/2003 | Rice |
| 2015/0035387 | A1 | 2/2015 | MacNamara et al. |
| 2018/0138102 | A1* | 5/2018 | Pan .................. H10H 20/852 |

FOREIGN PATENT DOCUMENTS

| CN | 103213936 A | 7/2013 |
| CN | 104241281 A | 12/2014 |

(Continued)

*Primary Examiner* — Anthony R Jimenez
(74) *Attorney, Agent, or Firm* — HOUTTEMAN LAW LLC

(57) ABSTRACT

An electronic device includes a substrate having a first surface and a second surface opposite to each other in a thickness direction of the substrate, wherein the substrate has first and second connection vias which penetrate through the substrate in the thickness direction of the substrate, and first and second conductive pillars are respectively in the first connection via and the second connection via; a switch on the first surface of the substrate and comprising first and second signal electrodes, wherein the first signal electrode is electrically coupled to a first terminal of the first conductive pillar, and the second signal electrode is electrically coupled to a first terminal of the second conductive pillar; and a filter on the second surface of the substrate.

18 Claims, 8 Drawing Sheets

(51) Int. Cl.
  *H05K 1/03*  (2006.01)
  *H05K 1/11*  (2006.01)
  *H05K 1/18*  (2006.01)

(52) U.S. Cl.
  CPC ........ *H05K 1/181* (2013.01); *B81B 2201/014* (2013.01); *B81B 2203/0118* (2013.01); *H05K 2201/10053* (2013.01); *H05K 2201/1006* (2013.01)

(58) Field of Classification Search
  CPC ... H05K 1/00; H05K 1/03; H05K 1/11; H05K 1/18; B81C 99/00
  USPC ........................................................ 200/181
  See application file for complete search history.

(56) References Cited

FOREIGN PATENT DOCUMENTS

| | | |
|---|---|---|
| CN | 106252800 A | 12/2016 |
| CN | 110944936 A | 3/2020 |
| CN | 112839429 A | 5/2021 |
| TW | 201833019 A | 9/2018 |

\* cited by examiner

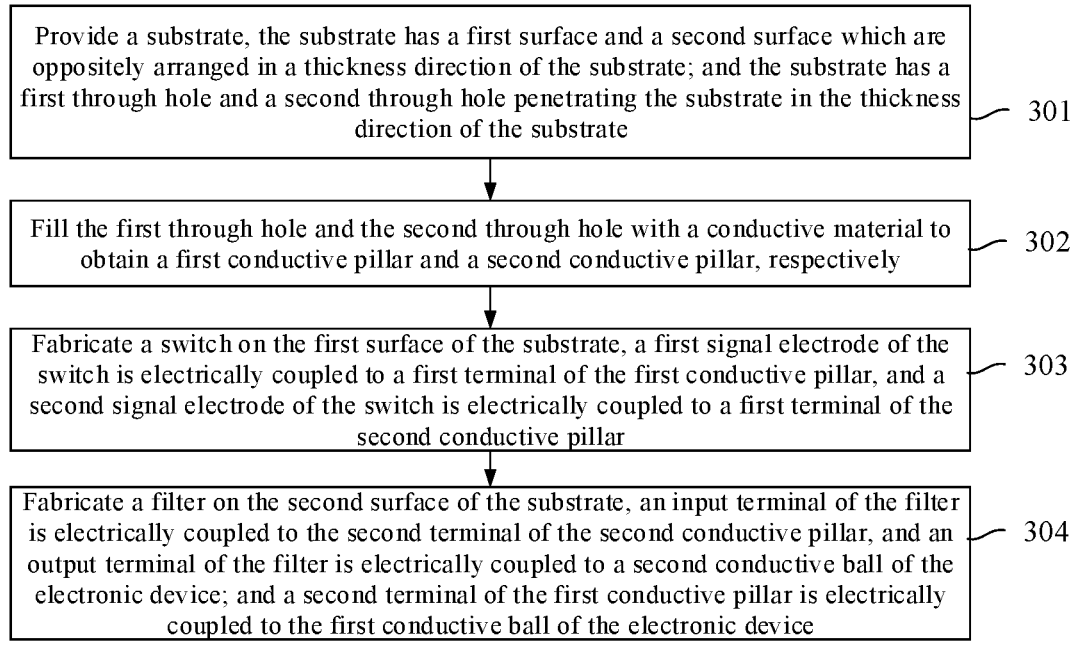

Provide a substrate, the substrate has a first surface and a second surface which are oppositely arranged in a thickness direction of the substrate; and the substrate has a first through hole and a second through hole penetrating the substrate in the thickness direction of the substrate — 301

Fill the first through hole and the second through hole with a conductive material to obtain a first conductive pillar and a second conductive pillar, respectively — 302

Fabricate a switch on the first surface of the substrate, a first signal electrode of the switch is electrically coupled to a first terminal of the first conductive pillar, and a second signal electrode of the switch is electrically coupled to a first terminal of the second conductive pillar — 303

Fabricate a filter on the second surface of the substrate, an input terminal of the filter is electrically coupled to the second terminal of the second conductive pillar, and an output terminal of the filter is electrically coupled to a second conductive ball of the electronic device; and a second terminal of the first conductive pillar is electrically coupled to the first conductive ball of the electronic device — 304

FIG. 3

FIG. 4

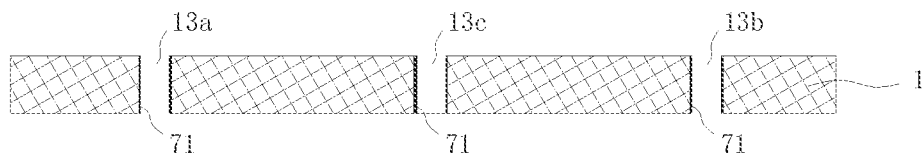

FIG. 5

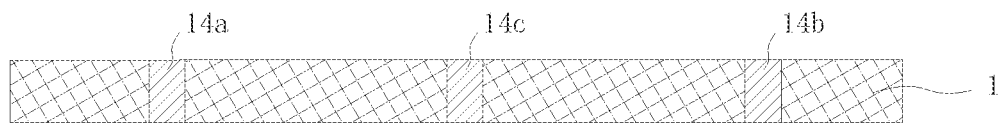

FIG. 6

ELECTRONIC DEVICE AND METHOD OF FABRICATING THE SAME

CROSS-REFERENCE TO RELATED APPLICATION

This is a National Phase Application filed under 35 U.S.C. 371 as a national stage of PCT/CN2022/084486, filed on Mar. 31, 2022, the contents of which are incorporated herein in their entirety by reference.

TECHNICAL FIELD

The present disclosure relates to the field of micro-electro-mechanical technology, and particularly relates to an electronic device and a method of fabricating the same.

BACKGROUND

With the improvement of semiconductor process, various electronic devices gradually develop towards miniaturization and microminiaturization. For example, with the advent of MEMS (Micro-Electro-Mechanical System) technology and IPD (Integrated Product Development) technology, a size of each chip, a distance between chips, and a size of each packaged device have been greatly reduced, so that various electronic devices have been rapidly developed toward functionalization and integration. Therefore, how to improve the functionalization and integration of electronic devices becomes a research focus.

SUMMARY

The present disclosure provides an electronic device and a method of fabricating the same.

In a first aspect, the present disclosure provides an electronic device, including: a substrate having a first surface and a second surface opposite to each other in a thickness direction of the substrate, wherein the substrate has a first connection via and a second connection via which penetrate through the substrate in the thickness direction of the substrate, and a first conductive pillar and a second conductive pillar are respectively in the first connection via and the second connection via; a switch on the first surface of the substrate and including a first signal electrode and a second signal electrode, wherein the first signal electrode is electrically coupled to a first terminal of the first conductive pillar, and the second signal electrode is electrically coupled to a first terminal of the second conductive pillar; a filter on the second surface of the substrate, wherein an input terminal of the filter is electrically coupled to a second terminal of the second conductive pillar, and an output terminal of the filter is electrically coupled to a second conductive ball of the electronic device, and a second terminal of the first conductive pillar is electrically coupled to a first conductive ball of the electronic device.

The electronic device further includes an electrode layer on the first surface of the substrate, and the first signal electrode and the second signal electrode are in the electrode layer.

The switch further includes a driving electrode in the electrode layer and a cantilever, and the driving electrode is between the first signal electrode and the second signal electrode; the substrate has a third connection via penetrating through the substrate along the thickness direction of the substrate, the third connection via is between the first connection via and the second connection via, a third conductive pillar is in the third connection via, a first terminal of the third conductive pillar is electrically coupled to the driving electrode, and a second terminal of the third conductive pillar is electrically coupled to a third conductive ball of the electronic device; and a first terminal of the cantilever is electrically coupled to the first signal electrode, a second terminal of the cantilever is electrically coupled to the second signal electrode in response to an on state of the switch, and the second terminal of the cantilever is disconnected from the second signal electrode in response to an off state of the switch.

The electronic device further includes a contact passivation layer on a first surface of the second signal electrode, the contact passivation layer is below the cantilever, and the second terminal of the cantilever is in contact with the contact passivation layer in response to the on state of the switch.

The electronic device further includes an insulating dielectric layer on a first surface of the driving electrode.

The electronic device further includes a package cover plate, the package cover plate includes a cover plate body and an accommodation space on the cover plate body, the package cover plate is on the first surface of the substrate, the accommodation space has an open facing the substrate, and the switch is in the accommodation space.

The electronic device further includes a first insulating layer on a surface of a first wiring layer and on a side of the first wiring layer away from the substrate, a second wiring layer on a surface of the first insulating layer and on a side of the first insulating layer away from the substrate, a third insulating layer on a surface of the second wiring layer and on a side of the second wiring layer away from the substrate, and a third wiring layer on a surface of the third insulating layer and on a side of the third insulating layer away from the substrate; and the filter includes a capacitor, wherein a first plate of the capacitor is in the second wiring layer and is electrically coupled to a corresponding conductive line in the first wiring layer, a second plate of the capacitor is in the third wiring layer, and a dielectric layer of the capacitor is in the third insulating layer.

A surface area of the second plate of the capacitor is less than a surface area of the third insulating layer.

The electronic device further includes a second insulating layer covering a second surface of the second wiring layer.

The electronic device further includes a fourth wiring layer on a second surface of the second insulating layer, and the second plate of the capacitor is electrically coupled to a corresponding conductive line in the fourth wiring layer.

The electronic device further includes a fourth insulating layer and a fifth wiring layer, the fourth insulating layer is between the third wiring layer and the fifth wiring layer, conductive lines in the third wiring layer are electrically coupled to corresponding conductive lines in the fifth wiring layer, and conductive lines in the fourth wiring layer are electrically coupled to corresponding conductive lines in the fifth wiring layer.

The electronic device further includes a fifth insulating layer and a sixth insulating layer on a second surface of the fifth wiring layer, wherein the sixth insulating layer is on a side of the fifth insulating layer away from the substrate; and vias penetrating through the fifth insulating layer and the sixth insulating layer in a thickness direction of the fifth insulating layer and the sixth insulating layer, wherein the vias are at positions corresponding to conductive lines in the fifth wiring layer, and conductive balls electrically coupled to an external device are in the vias and electrically coupled to the conductive lines in the fifth wiring layer.

The substrate is a glass substrate.

In a second aspect, the present disclosure provides a method of fabricating an electronic device, including: providing a substrate, wherein the substrate has a first surface and a second surface opposite to each other in a thickness direction of the substrate, and the substrate has a first connection via and a second connection via which penetrate through the substrate in the thickness direction of the substrate; filling the first connection via and the second connection via with a conductive material, to obtain a first conductive pillar and a second conductive pillar respectively; fabricating a switch on the first surface of the substrate, wherein a first signal electrode of the switch is electrically coupled to a first terminal of the first conductive pillar, and a second signal electrode of the switch is electrically coupled to a first terminal of the second conductive pillar; and fabricating a filter on the second surface of the substrate, wherein an input terminal of the filter is electrically coupled to a second terminal of the second conductive pillar, and an output terminal of the filter is electrically coupled to a second conductive ball of the electronic device, and a second terminal of the first conductive pillar is electrically coupled to a first conductive ball of the electronic device.

The connection vias are formed by a through glass via (TGV) technology.

BRIEF DESCRIPTION OF DRAWINGS

FIG. 3 is a flow chart of a method of fabricating an electronic device according to an embodiment of the present disclosure;

FIG. 4 is a schematic diagram of a structure formed in Step S11 in a packaging method according to an embodiment of the present disclosure;

FIG. 5 is a schematic diagram of a structure formed in Step S12 in the packaging method according to an embodiment of the present disclosure;

FIG. 6 is a schematic diagram of a structure formed in Step S13 in the packaging method according to an embodiment of the present disclosure;

Figure 1:
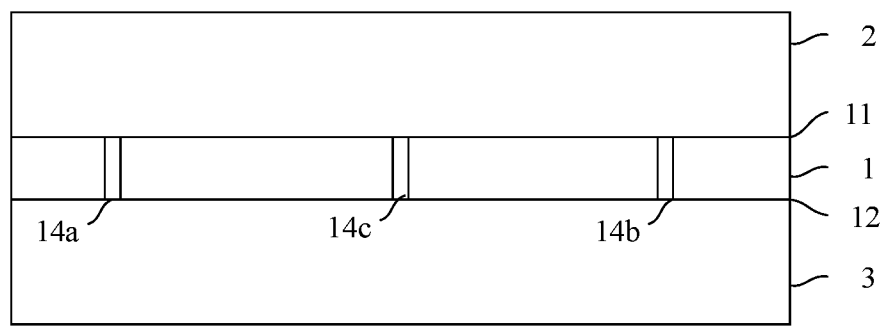
FIG. 1 is a schematic diagram of an electronic device according to an embodiment of the present disclosure.

The reference numbers are:

1—substrate, 11—first surface, 12—second surface, 13a—first connection via, 13b—second connection via, 13c—third connection via, 14a—first conductive pillar, 14b—second conductive pillar, 14c—third conductive pillar, 16—insulating dielectric layer, 2—MEMS switch, 21—first signal electrode, 22—second signal electrode, 23—driving electrode, 24—cantilever, 25—contact passivation layer, 26—sacrificial layer, 27—cantilever hole, 28—cantilever mold, 3—filter, 43—package cover plate, 431—cover plate body, 44—package bonding glue, 432—accommodation space, 51—first wiring layer, 52—second wiring layer, 53—third wiring layer, 54—fourth wiring layer, 55—fifth wiring layer, 61—first insulating layer, 62—second insulating layer, 63—third insulating layer, 64—fourth insulating layer, 65—fifth insulating layer, 66—sixth insulating layer, 71—first seed layer, 72—second seed layer, 8a—first conductive ball, 8b—second conductive ball, 8c—third conductive ball.

DETAIL DESCRIPTION OF EMBODIMENTS

In order to enable one of ordinary skill in the art to better understand the technical solutions of the present disclosure/utility model, the present disclosure/utility model will be described in further detail with reference to the accompanying drawings and the specific embodiments.

Unless defined otherwise, technical or scientific terms used herein shall have the ordinary meanings as understood by one of ordinary skill in the art to which the present disclosure belongs. The term "first," "second," or the like used in the present disclosure is not intended to indicate any order, quantity, or importance, but rather is used to distinguish one element from another. Also, the term "a," "an," "the" or similar referent does not denote a limitation of quantity, but rather denote the presence of at least one. The word "comprise", "include", or the like, means that the element or item preceding the word includes the element or item listed after the word and its equivalent, but does not exclude other elements or items. The term "connected", "coupled" or the like is not restricted to physical or mechanical connections, but may include electrical connections, whether direct or indirect. The term "upper", "lower", "left", "right", or the like is used only to indicate relative positional relationship, and when the absolute position of the object being described is changed, the relative positional relationship may also be changed accordingly.

A MEMS switch and a filter have continuity in function, the MEMS switch is configured to control on/off of a circuit, and the filter is configured to realize a filter function. The filter may be an LC filter, and the filter function is realized by a complex circuit including capacitors and inductors. The MEMS switch is controlled to select filters of different frequency bands, so as to meet a corresponding filter requirement.

In the related art, the MEMS switch and the filter are independent devices and are packaged separately, resulting in that the process is complex and the fabricating cost is high; moreover, the occupied area is large, and the connection line used for the MEMS switch and the filter is long, resulting in that the insertion loss of signals is high.

An embodiment of the present disclosure provides an electronic device, which integrates a switch and a filter together and packages them, and thus, the process can be simplified, the fabricating cost can be reduced, the integration level of the switch and the filter can be improved, and the total size can be reduced.

It should be noted that the switch in the electronic device may be a MEMS switch, or may be another switch. For ease of description, the present disclosure is described in terms of the MEMS switch.

FIG. 1 is a schematic diagram of an electronic device according to an embodiment of the present disclosure. As shown in FIG. 1, the electronic device includes a substrate 1, a MEMS switch 2, and a filter 3. The substrate 1 has a first surface 11 and a second surface 12 oppositely disposed in a thickness direction of the substrate; the substrate 1 has a first connection via and a second connection via penetrating through the substrate 1 in the thickness direction of the substrate, and a first conductive pillar 14a and a second conductive pillar 14b are respectively provided in the first connection via and the second connection via; the MEMS switch 2 is disposed on the first surface 11 of the substrate, and includes a first signal electrode and a second signal electrode, the first signal electrode is electrically coupled to a first terminal of the first conductive pillar 14a, and the second signal electrode is electrically coupled to a first terminal of the second conductive pillar 14b; the filter 3 is disposed on the second surface 12 of the substrate 1; an input terminal of the filter 3 is electrically coupled to a second terminal of the second conductive pillar 14b, and an output terminal of the filter 3 is electrically coupled to a second conductive ball of the electronic device; and a second terminal of the first conductive pillar 14a is electrically coupled to a first conductive ball of the electronic device.

The first surface 11 and the second surface 12 of the substrate 1 refer to two opposite surfaces of the substrate 1, which does not limit the surface of the substrate 1. For convenience of description, in the embodiments of the present disclosure, the upper surface is referred to as the first surface and the lower surface is referred to as the second surface. For the substrate 1, the upper surface of the substrate 1 is referred to as the first surface 11, and the lower surface of the substrate 1 is referred to as the second surface. The first surface and the second surface of the other layers in the embodiments of the present disclosure are defined in the same manner as the first surface and the second surface of the substrate 1, which are not described herein. The definition of the upper and lower surfaces is based on the MEMS switch 2 being located above the filter 3, i.e., the MEMS switch 2 is located above the substrate 1, the filter 3 is located below the substrate 1, the surface located above is referred to as the upper surface, and the surface located below is referred to as the lower surface.

In the embodiment of the present disclosure, three conductive pillars are shown, but the number, sizes, and positions of the conductive pillars may be set as needed, and the number, sizes, and positions of the conductive pillars are not limited in the embodiments of the present disclosure.

The MEMS switch 2 and the filter 3 are integrated on one substrate 1 in the embodiments of the present disclosure, so that the integration level is improved, the total size of the MEMS switch 2 and the filter 3 is reduced. In addition, the MEMS switch 2 and the filter 3 are oppositely disposed on the first surface 11 and the second surface 12 of the substrate 1, so that the connection line between the MEMS switch 2 and the filter 3 can be shortened, and the insertion loss of signals can be reduced.

Figure 2:
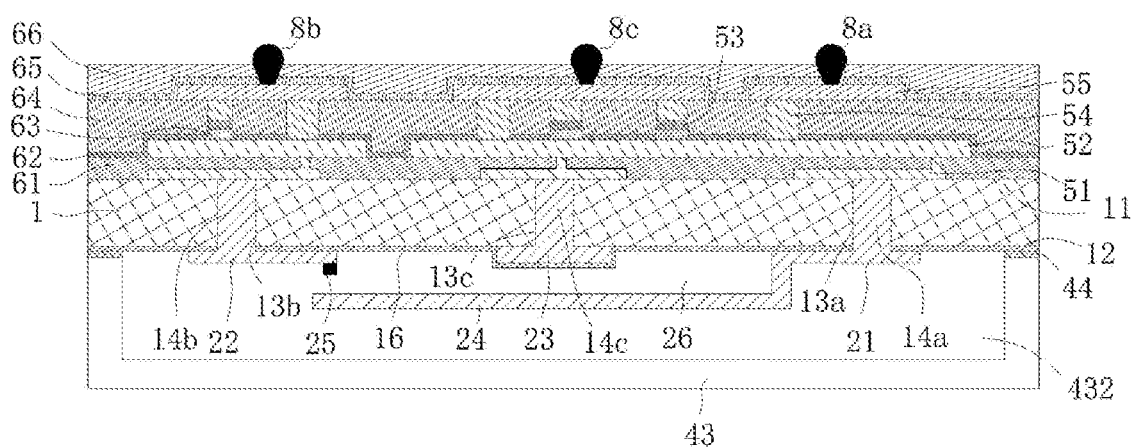
FIG. 2 is a cross-sectional view of an electronic device according to an embodiment of the present disclosure.

FIG. 2 is a cross-sectional view of an electronic device according to an embodiment of the present disclosure. As shown in FIG. 2, an electrode layer is disposed on the first surface 11 of the substrate 1, and a first signal electrode 21 and a second signal electrode 22 of the MEMS switch 2 are disposed in the electrode layer.

The number of electrodes of the MEMS switch 2 may be set according to the structure of the MEMS switch 2. Illustratively, in a case where the electrodes of the MEMS switch 2 are cantilever electrodes, the electrodes of the MEMS switch 2 include a signal electrode and a control electrode. The control electrode is configured to control on/off of the MEMS switch 2, and the signal electrode is used as a carrier (path) for transmission of electronic signals.

In some embodiments, a first wiring layer 51 is disposed on the second surface 12 of the substrate 1, and the second terminals of the conductive pillars 14 are electrically coupled to conductive lines disposed in the first wiring layer 51.

In an embodiment of the present disclosure, the first wiring layer 51 is disposed on the second surface 12 of the substrate 1, and may serve as a redistribution wiring layer of the MEMS switch 2, so as to achieve electrical connection with a corresponding conductive ball (solder ball).

In some embodiments, the MEMS switch further includes a driving electrode 23 and a cantilever 24, the first signal electrode 21, the second signal electrode 22, the driving electrode 23 are disposed in the electrode layer, and the driving electrode 23 is located between the first signal electrode 21 and the second signal electrode 22.

The substrate 1 has a third connection via 13c penetrating through the substrate 1 in the thickness direction of the substrate 1, the third connection via 13c is disposed between the first connection via 13a and the second connection via 13b, and a third conductive pillar 14c is disposed in the third connection via 13c; a first terminal of the third conductive pillar 14c is electrically coupled to the driving electrode 23; and a second terminal of the third conductive pillar 14c is electrically coupled to a third conductive ball 8c of the electronic device.

The driving electrode 23 is electrically coupled to the first terminal of the third conductive pillar 14c, and the second terminal of the third conductive pillar 14c is electrically coupled to the wiring layer disposed on the second surface of the substrate 1, and indirectly electrically coupled to the third conductive ball 8c of the electronic device.

A first terminal of the cantilever 24 is electrically coupled to the first signal electrode 21, and a second terminal of the cantilever 24 is a moving terminal (or free terminal). When the MEMS switch 2 is in the on state, the second terminal of the cantilever 24 is electrically coupled to the second signal electrode 22, and when the MEMS switch 1 is in the off state, the second terminal of the cantilever 24 is disconnected from the second signal electrode 22.

In some embodiments, the driving electrode 23 is used to provide the power (attracting force) for the movement of the cantilever 24, the second terminal of the cantilever 24 is electrically coupled to the second signal electrode 22 when the driving electrode 23 applies an action force to the cantilever 24, and the second terminal of the cantilever 24 is separated from the second signal electrode 22 when the action force from the driving electrode 23 is removed.

In some embodiments, a contact passivation layer 25 is disposed on the first surface of the second signal electrode 22, the contact passivation layer 25 is located below the cantilever 24, and the second terminal of the cantilever 24 is in contact with the contact passivation layer 25 when the MEMS switch 2 is in the on state.

The contact passivation layer 25 is disposed at a position of a contact, and the contact is located on the first surface of the second signal electrode 22. When the second terminal of the cantilever 24 contacts the second signal electrode 22, the second signal electrode 22 is easily damaged due to collision, but the contact passivation layer 25 can protect the contact.

In some embodiments, since the second terminal of the cantilever 24 has the largest amplitude of movement, it may be advantageous to the electrical connection of the second terminal of the cantilever 24 to the second signal electrode 22 by arranging the contact passivation layer 25 below the second terminal of the cantilever 24.

In some embodiments, the contact passivation layer 25 is made of a material with good conductivity, stability and hardness, so as to prevent damage to and adhesion of the contact passivation layer 25 and the cantilever 24 due to the collisions during the repeated rise and fall processes of the cantilever 24. For example, the contact passivation layer 25 may be made of a metal material that includes ruthenium (Ru), tungsten (W), platinum (Pt), aluminum (Al), or the like.

In the embodiment of the present disclosure, the second terminal of the cantilever 24 is indirectly electrically coupled to the second signal electrode 22 through the contact passivation layer 25, so that the moving range of the second terminal of the cantilever 24 can be shortened, the probability that the cantilever 24 is damaged due to a large moving range is reduced, and the service life of the cantilever 24 is prolonged; also, the action force applied by the driving electrode 23 can be reduced, thereby reducing power consumption.

In some embodiments, a first surface of the driving electrode 23 is provided with an insulating dielectric layer 16.

The insulating dielectric layer 16 may be made of a material that includes silicon nitride, silicon oxide, or the like.

In an embodiment of the present disclosure, the insulating dielectric layer 16 is used to protect the driving electrode 23 and prevent the driving electrode 23 from being electrically coupled to the remaining circuits in the MEMS switch 2 to cause short circuit.

In some embodiments, the electronic device further includes a package cover plate 43, the package cover plate 43 includes a cover plate body 431 and an accommodation space 432 disposed on the cover body 431, the package cover plate 43 is stacked on the first surface 11 of the substrate 1, an open of the accommodation space 432 is towards the substrate 1, and the MEMS switch 2 is disposed in the accommodation space 432.

The package cover plate 43 may be made of glass, or other suitable materials.

The MEMS switch 2 is packaged by the package cover plate 43 in the embodiments of the present disclosure, so that the MEMS switch 2 can be protected, and the service life of the MEMS switch 2 can be prolonged.

In some embodiments, a first insulating layer 61 is disposed on a second surface of the first wiring layer 51 and on a side of the first wiring layer 51 away from the substrate 1, a second wiring layer 52 is disposed on a surface of the first insulating layer 61 and on a side of the first insulating layer 61 away from the substrate 1, a third insulating layer 63 is disposed on a surface of the second wiring layer 52 and on a side of the second wiring layer 52 away from the substrate 1, and a third wiring layer 53 is disposed on a surface of the third insulating layer 63 and on a side of the third insulating layer 63 away from the substrate 1.

The filter 3 includes a capacitor (not shown in the figure), a first plate of the filter 3 is disposed in the second wiring layer 52, and the first plate of the capacitor is electrically coupled to the corresponding conductive line in the first wiring layer 51; a second plate of the capacitor is disposed in the third wiring layer 53, and a dielectric layer of the capacitor is disposed in the third insulating layer 63.

In the present embodiment, the filter 3 is isolated from the first wiring layer 51 by the first insulating layer 61, and conductive pillars are disposed in the thickness direction of the first insulating layer 61 to electrically couple the conductive lines in the first wiring layer 51 to the corresponding conductive lines in the second wiring layer 52.

The first insulating layer 61 is made of a material that includes silicide such as silicon nitride and silicon oxide, and may further include organic materials such as polyimide and acrylic. The third insulating layer 63 is made of a material including silicide such as silicon nitride and silicon oxide, and has a thickness of 2 μm to 5 μm. A thickness of the third wiring layer 53 may be 0.2 μm.

In some embodiments, a surface area of the second plate of the capacitor is less than the surface area of the third insulating layer. The surface area of the second plate of the capacitor is smaller than the surface area of the third insulating layer 63, so that it is possible to ensure that the second plate of the capacitor does not contact the second wiring layer 52.

It is to be noted that, in a case where only the second plate of the capacitor is provided in the third wiring layer 53, the surface area of the third wiring layer 53 is smaller than the surface area of the third insulating layer 63.

It is also to be noted that in the electronic device shown in FIG. 2, only the capacitor in the LC filter is shown, and the inductor is not shown, but the inductor may be fabricated together with the capacitor, that is, the inductor may be disposed in the second wiring layer 52 and/or the fifth wiring layer 55.

In some embodiments, the electronic device further includes a second insulating layer 62, the second insulating layer 62 covering a second surface of the second wiring layer 52.

The second insulating layer 62 may be made of a material including silicide such as silicon nitride and silicon oxide, or organic material such as polyimide and acrylic.

In the embodiment of the present disclosure, the second insulating layer 62 can prevent the formed second wiring layer 52 and other devices from being oxidized by air.

In some embodiments, the electronic device further includes a fourth wiring layer 54, the fourth wiring layer 54 is disposed on a second surface of the second insulating layer 62, and the second plate of the capacitor is electrically coupled to the corresponding conductive line in the fourth wiring layer 54.

In the fourth wiring layer 54, a wire connection pillar may be disposed, so as to electrically couple a conductive line in the second wiring layer 52 to a corresponding conductive line in a fifth wiring layer 55 described below, that is, electrically couple an input terminal or an output terminal of the filter or the MEMS switch to a corresponding conductive line in the fifth wiring layer 55.

In some embodiments, the fourth wiring layer 54 may be made of a conductive material, such as a metal material, e.g., gold, copper, silver, aluminum, etc.

In some embodiments, the electronic device further includes a fourth insulating layer 64 and a fifth wiring layer 55, the fourth insulating layer 64 is disposed between the third wiring layer 53 and the fifth wiring layer. In addition, the conductive lines in the third wiring layer 53 are electrically coupled to the corresponding conductive lines in the fifth wiring layer 55, and the conductive lines in the fourth wiring layer 54 are electrically coupled to the corresponding conductive lines in the fifth wiring layer 55.

The fourth insulating layer 64 is used to isolate the third wiring layer 53 from the fifth wiring layer 55, so as to prevent the third wiring layer 53 and the fifth wiring layer 55 from being electrically coupled with each other in an unnecessary area, which affects the performance of the filter 3 and thus the performance of the electronic device.

It should be noted that the second insulating layer 62 and the third insulating layer 63 can prevent the second wiring layer 52, and the third wiring layer 53 from being oxidized by air when the fourth wiring layer 54, the sixth insulating layer 66 and the device are fabricated.

In some embodiments, a fifth insulating layer 65 and the sixth insulating layer 66 are sequentially stacked on a second surface of the fifth wiring layer 55, the sixth insulating layer 66 is located on a side of the fifth insulating layer 65 away from the substrate 1, connection vias penetrating through the fifth insulating layer 65 and the sixth insulating layer 66 in the thickness direction thereof are provided, and the connection vias are located to correspond to the conductive lines in the fifth wiring layer 55, and conductive balls 8 electrically coupled to external devices pass through the connection vias and are electrically coupled to the corresponding conductive lines in the fifth wiring layer 55.

The fifth insulating layer 65 and the sixth insulating layer 66 may be made of a material including silicon nitride, silicon oxide, or the like. The fifth insulating layer 65 is stacked on the second surface of the fifth wiring layer 55 to cover the fifth wiring layer 55, so as to prevent the fifth wiring layer 55 from being oxidized by air when the sixth insulating layer 66 is fabricated.

In an embodiment of the present disclosure, the conductive balls 8 are implanted in the connection vias, the conductive balls 8 may be solder balls or made of other materials favorable for electrical connection.

In some embodiments, the substrate 1 is a glass substrate.

According to the electronic device of the embodiment of the present disclosure, the MEMS switch and the filter are respectively arranged on the first surface and the second surface of the substrate, and the output terminal of the MEMS switch and the input terminal of the filter are electrically coupled through the connection vias arranged in the substrate, so that the MEMS switch and the filter are packaged together, the integration level of the MEMS switch and the filter is improved, the size is reduced, the process can be simplified, and the fabricating cost can be reduced.

The electronic device according to the embodiment of the present disclosure may be used in the field of consumer electronics, with the frequency ranges of sub-6G and 5G.

An embodiment of the present disclosure also provides a fabrication method of the electronic device. FIG. 3 is a flowchart of a method for fabricating an electronic device according to an embodiment of the present disclosure. As shown in FIG. 3, the method of fabricating an electronic device includes Step S301 to Step S304.

Step S301 includes providing a substrate, the substrate has a first surface and a second surface which are oppositely arranged in a thickness direction of the substrate; and the substrate has a first connection via and a second connection via penetrating though the substrate in the thickness direction of the substrate.

Step S302 includes filling the first connection via and the second connection via with a conductive material to obtain a first conductive pillar and a second conductive pillar, respectively.

Step S303 includes fabricating a switch on the first surface of the substrate, a first signal electrode of the switch is electrically coupled to a first terminal of the first conductive pillar, and a second signal electrode of the switch is electrically coupled to a first terminal of the second conductive pillar.

Step S304 includes fabricating a filter on the second surface of the substrate, an input terminal of the filter is electrically coupled to the second terminal of the second conductive pillar, and an output terminal of the filter is electrically coupled to a second conductive ball of the electronic device; and a second terminal of the first conductive pillar is electrically coupled to a first conductive ball of the electronic device.

In some embodiments, the connection vias are fabricated using through glass via (TGV) technology.

For a better understanding of the electronic device shown in FIG. 2, the following description is made in conjunction with the fabrication methods provided in the examples of the present disclosure.

Step S301 includes Steps S11 and S12.

Step S11 includes providing a substrate 1, the substrate 1 is a glass substrate or a high-resistance silicon substrate, as shown in FIG. 4.

A thickness of the substrate 1 may be 0.1 mm to 1 mm.

Step S12 includes forming first, second, and third connection vias 13a, 13b, and 13c penetrating through the glass substrate 1 in the thickness direction of the glass substrate 1, and fabricating first seed layers 71 in the first, second, and third connection vias 13a, 13b, and 13c, respectively, as shown in FIG. 5.

In some embodiments, the first connection via 13a, the second connection via 13b, and the third connection via 13c in the substrate 1 may be formed by a process including, but not limited to, mechanical drilling, laser drilling, photolithographic drilling, TGV technology, or the like. In an embodiment of the present disclosure, TGV technology is adopted to form the connection vias 13 in the substrate.

Step S12 specifically includes steps (1) to (3).

(1) Cleaning includes ultrasonic cleaning with organic solvent such as deionized water, ethanol, isopropanol, etc. for about 20 min.

(2) laser drilling includes using a laser such that a laser beam is normally incident on the surface of the substrate 1, to form the first connection via 13a, the second connection via 13b and the third connection via 13c in the substrate 1. Specifically, when the laser beam interacts with the substrate 1, atoms in the substrate 1 are ionized and ejected out of the surface of the substrate 1 due to the high energy of the laser photons, and the drilled holes are gradually deepened with time until the entire substrate 1 is drilled, i.e., the first connection via 13a, the second connection via 13b, and the third connection via 13c are formed. The laser wavelength may be 532 nm, 355 nm, 266 nm, 248 nm, 197 nm, etc., the pulse width of the laser may be 1-100 fs, 1-100 ps, 1-100 ns, etc., and the type of the laser may be continuous laser, pulse laser, etc. The cross-sectional shape of the connection via 13 may be square, trapezoidal, and hourglass-shaped, depend on the etching process.

The laser drilling method may include, but is not limited to, the following two methods. In the first method, when a diameter of a light spot is large, a relative position of a laser beam and the substrate 1 is fixed, the substrate 1 is directly drilled by high energy, the shape of the formed connection via is hourglass-shaped, with the diameter gradually reduced from top to bottom (in a direction from the first surface to the second surface). In the second method, when a diameter of a light spot is small, a laser beam scans the substrate 1 in circles, a focal point of the light spot is constantly changed, a depth of the focal point is constantly changed, a spiral line is drawn from the lower surface (second surface) of the substrate 1 to the upper surface (first surface) of the substrate 1, the radius for the spiral line is gradually reduced from bottom to top, the substrate 1 is cut to includes truncated cone shapes by the laser beam, which then fall down due to the action of gravity, thereby forming the connection vias. In this case, the first connection via 13a, the second connection via 13b and the third connection via 13c each have a truncated cone shape.

In some embodiments, the first, second, and third connection vias 13a, 13b, and 13c each have an aperture in a range of about 50 μm to 120 μm.

(3) The first seed layer 71 is fabricated on each of inner surfaces of the first connection via 13a, the second connection via 13b, and the third connection via 13c by a sputtering process.

In some embodiments, different materials may be selected as the first seed layers 71 according to different metals for main bodies of the first connection via 13a, the second connection via 13b, and the third connection via 13c. For example, the material of the first seed layer 71 includes at least one of titanium (Ti), tungsten (W), molybdenum (Mo), and nickel (Ni).

Step S302 includes Step S13 of fabricating conductive pillars 14 in the first connection via 13a, the second connection via 13b, and the third connection via 13c by an electroplating process, as shown in FIG. 6.

In some embodiments, the connection vias 13 are filled with the conductive metal by the electroplating process to form the first conductive pillar 14a, the second conductive pillar 14b, and the third conductive pillar 14c, respectively.

The substrate 1 is placed on a carrier of an electroplating machine and a power-up pad is placed on the substrate 1 to form a whole assembly piece; the assembly piece is placed in a hole-filling electroplating bath (specified hole-filling electrolyte is used in the bath) with applied current, the electroplating solution keeps flowing continuously and quickly on the surface of the substrate 1, positive ions in the electroplating solution on inner walls of the first connection via 13a, the second connection via 13b and the third connection via 13c obtain electrons, thereby forming atoms to be deposited on the inner walls. By means of the specified hole-filling electrolyte with special proportion, the metal copper may be deposited at high speed (in a range of 0.5 μm/min to 3 μm/min) mainly in the first connection via 13a, the second connection via 13b and the third connection via 13c; and the deposition speed of the metal copper on the first surface and the second surface of the substrate 1 is extremely low (in a range of 0.005.00 ra to 0.05 m/min) since these two surface are flat. As time increases, the metal copper on the inner walls of the first, second, and third connection vias 13a, 13b, and 13c gradually grows thick and the first, second, and third connection vias 13a, 13b, and 13c are completely filled with the metal copper.

After the electroplating process, redundant metal on the first surface and the second surface of the substrate 1 needs to be removed by chemical mechanical polishing, and it is ensured that metal in the first connection via 13a, the second connection via 13b and the third connection via 13c is flat, and it is also ensured that the first conductive pillar 14a, the second conductive pillar 14b and the third conductive pillar 14c can all realize electrical conduction between the first surface and the second surface of the substrate 1.

Step S303 includes the following Steps S14 to S25.

Figure 7:
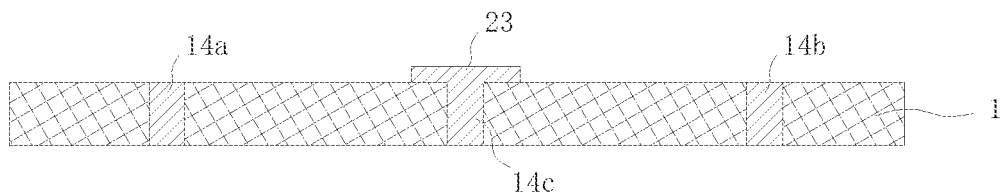
FIG. 7 is a schematic diagram of a structure formed in Step S14 in the packaging method according to an embodiment of the present disclosure.

Step S14 includes forming a driving electrode 23 on the first surface of the substrate 1, as shown in FIG. 7.

Step S14 specifically includes the following steps (1) to (3).

(1) A seed layer is fabricated on the first surface of the substrate 1.

The seed layer may be formed on the first surface of the substrate 1 by a sputtering process. Before the seed layer is fabricated, the substrate 1 is cleaned by ultrasonic waves, and the specific cleaning manner is the same as that in step S301, and is not described here.

In some embodiments, the seed layer may be made of a material including, but is not limited to, at least one of copper (Cu), aluminum (Al), molybdenum (Mo), and silver (Ag), and a thickness of the seed layer is in a range of 100 nm to 500 nm.

(2) Processes including spin-coating photoresist, exposure and development processes are sequentially performed on the first surface 11 of the substrate 1, and then metal wires are electroplated on the first surface 11 to form the driving electrode 23 of the MEMS switch.

In some embodiments, the driving electrode 23 is made of a material including at least one of gold (Au), aluminum (Al), ruthenium (Ru), and copper (Cu). A thickness of the driving electrode 23 is in a range of 1 μm to 4 μm.

(3) In order to ensure the flatness of the driving electrode 23, the surface thereof is treated by a chemical mechanical polishing process.

After the fabrication of the driving electrode 23 is completed, a second surface of the driving electrode 23 is attached with the first surface of the substrate 1.

Figure 8:
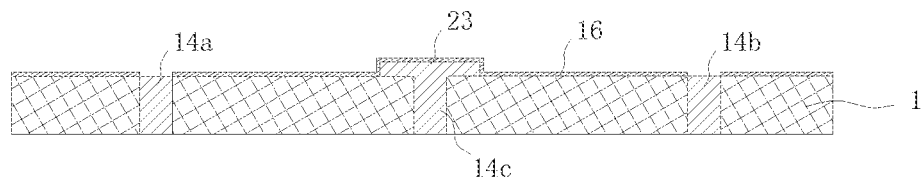
FIG. 8 is a schematic diagram of a structure formed in Step S15 in the packaging method according to an embodiment of the present disclosure.

In Step S15, an insulating dielectric layer 16 is formed on the second surface of the driving electrode 23, as shown in FIG. 8.

Step S15 specifically includes the following steps (1) and (2).

(1) The insulating dielectric layer 16 is fabricated on a first surface of the driving electrode 23 by PVD process or CVD process, and the insulating dielectric layer 16 is configured to protect the driving electrode 23, to prevent the driving electrode 23 from being coupled to the remaining circuits in the MEMS switch to cause short circuit.

It should be noted that during the fabrication of the insulating dielectric layer 16, the insulating dielectric layer 16 is also formed on other areas of the first surface of the substrate 1 in addition to the area where the driving electrode 23 is located.

In some embodiments, the insulating dielectric layer 16 is made of a material including silicide such as silicon nitride, silicon oxide, etc., and a thickness of the insulating dielectric layer 16 is in a range of 0.5 μm to 2 μm.

(2) The insulating dielectric layer is patterned by spin-coating photoresist, exposure and development processes, and the insulating dielectric layer on the surface of the conductive pillars 14 is at least removed, such that the conductive pillars 14 are exposed.

Figure 9:
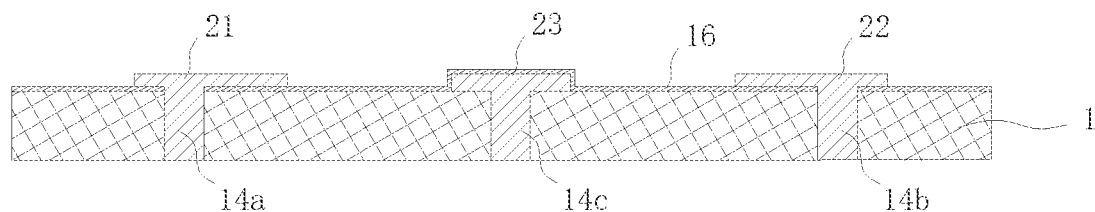
FIG. 9 is a schematic diagram of a structure formed in Step S16 in the packaging method according to an embodiment of the present disclosure.

In Step S16, a first signal electrode 21 and a second signal electrode 22 are fabricated on the first surface of the substrate 1, as shown in FIG. 9.

Step S16 specifically includes the following steps (1) and (2).

(1) A seed layer is fabricated on a surface of the patterned insulating dielectric layer by a sputtering process.

The seed layer is made of a material that includes, but is not limited to, at least one of copper (Cu), aluminum (Al), molybdenum (Mo) and silver (Ag), and a thickness of the seed layer is in a range of 100 nm to 500 nm.

(2) Spin-coating photoresist, exposure and development processes are sequentially performed, and then the first signal electrode and the second signal electrode are fabricated on the first surface of the substrate 1 by an electroplating process.

The first signal electrode and the second signal electrode are made of a material that includes at least one of gold (Au), aluminum (Al), ruthenium (Ru) and copper (Cu). A thickness of each of the first signal electrode and the second signal electrode is in a range of 1.5 μm to 4 μm.

Figure 10:
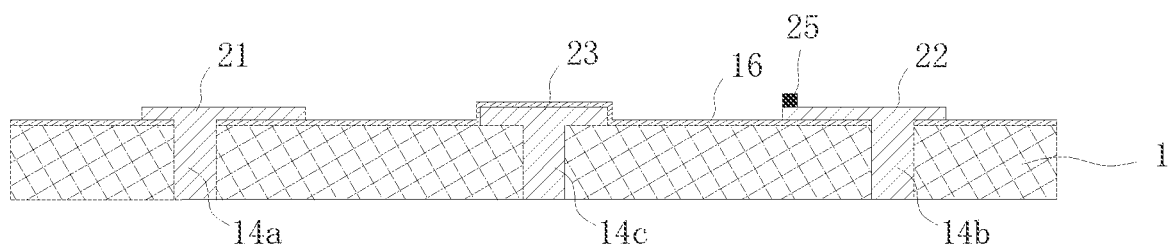
FIG. 10 is a schematic diagram of a structure formed in Step S17 in the packaging method according to an embodiment of the present disclosure.

In Step S17, a contact passivation layer is fabricated on a first surface of the second signal electrode, as shown in FIG. 10.

The contact passivation layer 25 is fabricated on the first surface of the second signal electrode 22 by magnetron sputtering process or the like, and the contact passivation layer 25 is located below the cantilever 24, so as to prevent damage to and adhesion of the contact passivation layer 25 and the cantilever 24 due to the collisions during the repeated rise and fall processes of the cantilever 24.

In some embodiments, the contact passivation layer 25 is made of a material with good conductivity, stability and hardness, such as ruthenium (Ru), tungsten (W), platinum (Pt), aluminum (Al), and other metals. A thickness of the contact passivation layer 25 is in a range of 100 nm to 500 nm.

Figure 11:
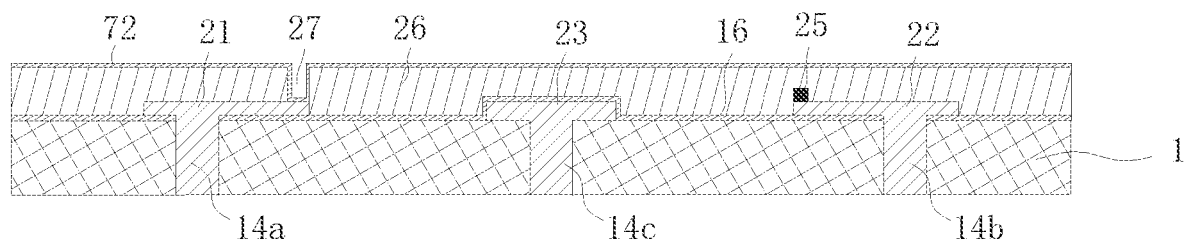
FIG. 11 is a schematic diagram of a structure formed in Step S18 in the packaging method according to an embodiment of the present disclosure.

In Step S18, a sacrificial layer 26 and a second seed layer 72 are fabricated, as shown in FIG. 11.

Step S18 specifically includes the following steps (1) to (3).

(1) The sacrificial layer is fabricated by a Physical Vapor Deposition (PVD) or Chemical Vapor Deposition (CVD) process, and a first surface of the sacrificial layer 26 is planarized by a mechanical polishing process.

In some embodiments, the sacrificial layer 26 is made of a material that includes an organic material or an inorganic material, the organic material includes at least one of photoresist and Polyimide (PI), and the inorganic material includes at least one of silicon oxide, silicon nitride and amorphous silicon. A thickness of the sacrificial layer 26 is set according to the structure of the cantilever 24, for example, the thickness of the sacrificial layer 26 is in a range of 0.5 μm to 5 μm. The sacrificial layer 26 is etched at the position of the cantilever to be formed to reserve a space for fabricating the cantilever.

(2) A cantilever hole 27 is obtained in the sacrificial layer 26 by an etching process, and the position of the cantilever hole 27 is determined according to the position of the cantilever 24 to be formed.

(3) A seed layer is fabricated on a second surface of the sacrificial layer 26 by a sputtering process, and the seed layer is made of a material that includes at least one of titanium (Ti), tungsten (W), molybdenum (Mo), and nickel (Ni).

Figure 12:
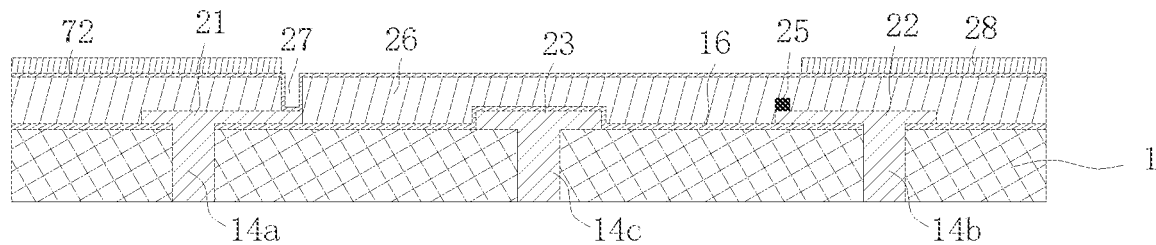
FIG. 12 is a schematic diagram of a structure formed in Step S19 in the packaging method according to an embodiment of the present disclosure.

In Step S19, a cantilever mold 28 is fabricated, as shown in FIG. 12.

(3) Spin-coating, exposure and development processes are sequentially performed on a first surface of the seed layer to obtain the cantilever mold 28.

Figure 13:
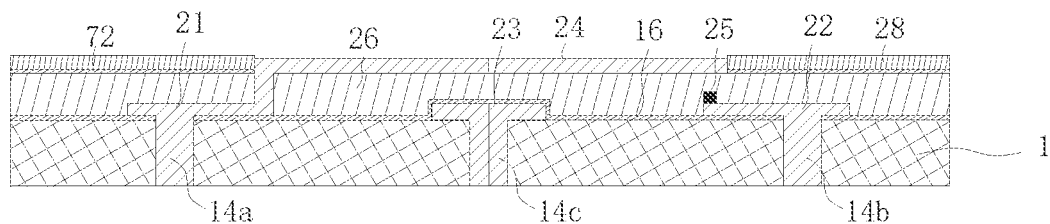
FIG. 13 is a schematic diagram of a structure formed in Step S20 in the packaging method according to an embodiment of the present disclosure.

Step S20 includes fabricating the cantilever, as shown in FIG. 13.

The cantilever 24 is formed by filling a material of the cantilever 24 in a space defined by the cantilever hole 27 and the cantilever mold 28 by an electroplating process.

In some embodiments, the material of the cantilever 24 is the same as that of the driving electrode 23, i.e., the material of the cantilever 24 includes at least one of gold (Au), aluminum (Al), ruthenium (Ru), and copper (Cu). The cantilever 24 has a thickness in a range of 3 μm to 10 μm.

Figure 14:
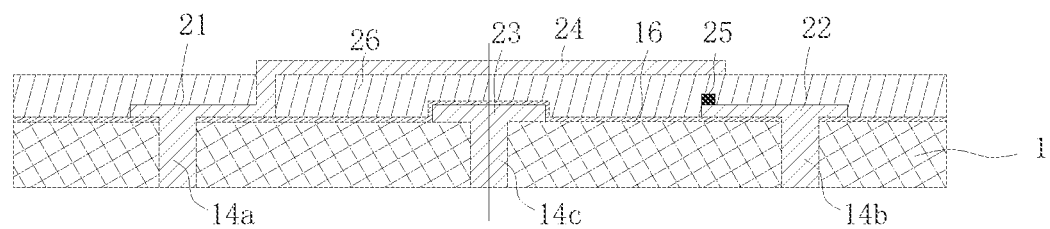
FIG. 14 is a schematic diagram of a structure formed in Step S21 in the packaging method according to an embodiment of the present disclosure.

Step S21 includes removing the cantilever mold 28, as shown in FIG. 14.

The cantilever mold 28 and the residual seed layer are removed by a wet or dry etching process, thereby exposing the sacrificial layer 26.

Figure 15:
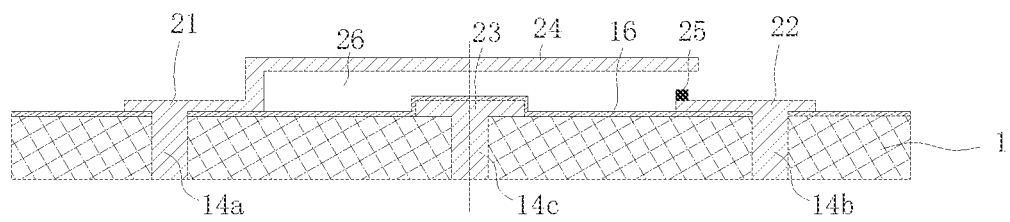
FIG. 15 is a schematic diagram of a structure formed in Step S22 in the packaging method according to an embodiment of the present disclosure.

Step S22 includes removing the sacrificial layer 26, as shown in FIG. 15.

The sacrificial layer is etched by a wet etching process (e.g., acid-base corroding) or a dry etching process to remove the sacrificial layer 26, thereby completing the fabrication of the MEMS switch. It should be noted that the process for removing the sacrificial layer 26 mainly depends on the material of the sacrificial layer 26, and the process for removing the sacrificial layer 26 is not limited in the embodiment of the present disclosure.

Figure 16:
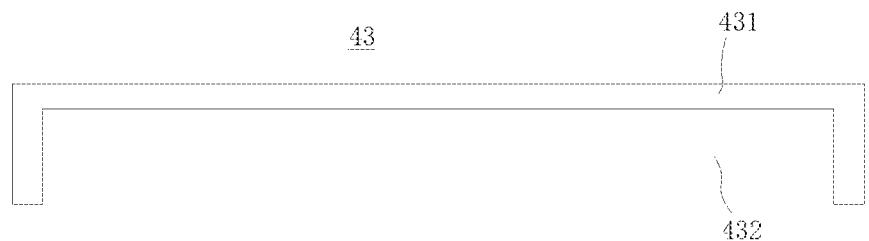
FIG. 16 is a schematic diagram of a structure formed in Step S23 in the packaging method according to an embodiment of the present disclosure.

Step S23 includes fabricating a package cover plate 43, as shown in FIG. 16.

The package cover plate is mainly obtained through the following steps (1) and (2).

(1) A glass substrate 431 is obtained.

A thickness of the glass substrate 431 is required to meet the requirements of packaging the MEMS switch, for example, the thickness of the package cover plate is in a range of 300 µm to 700 µm.

(2) The accommodation space 432 is obtained by performing etching for patterning on a surface of the glass substrate 431 by a wet etching process or a laser etching process, thereby obtaining the package cover plate.

In some embodiments, a depth of the accommodation space 432 is required to meet the requirements of packaging the MEMS switch, for example, the accommodation space 432 has a depth in a range of 20 µm to 50 µm.

Figure 17:
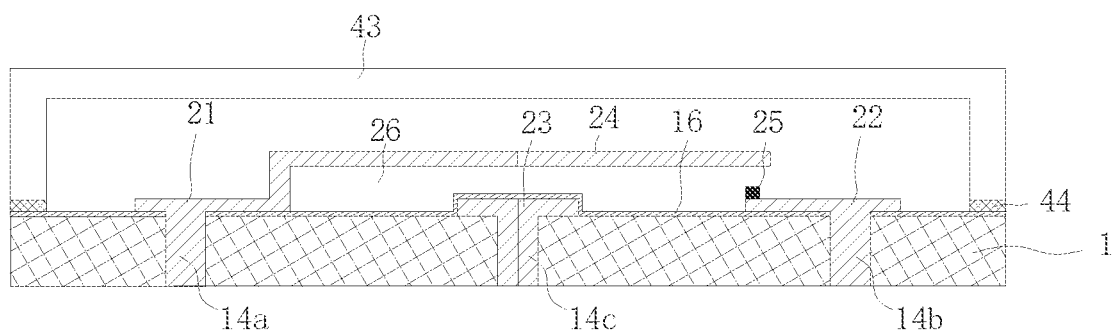
FIG. 17 is a schematic diagram of a structure formed in Step S24 in the packaging method according to an embodiment of the present disclosure.

Step S24 includes packaging the MEMS switch by using the package cover plate 43, as shown in FIG. 17.

The open of the package cover plate 43 is directed toward the substrate 1, and the package cover plate 43 is attached to the substrate 1, thereby completing the package of the MEMS switch.

In some embodiments, the package cover plate 43 and the MEMS switch are bonded to each other with a package bonding glue 44 to improve the packaging effect.

Figure 18:
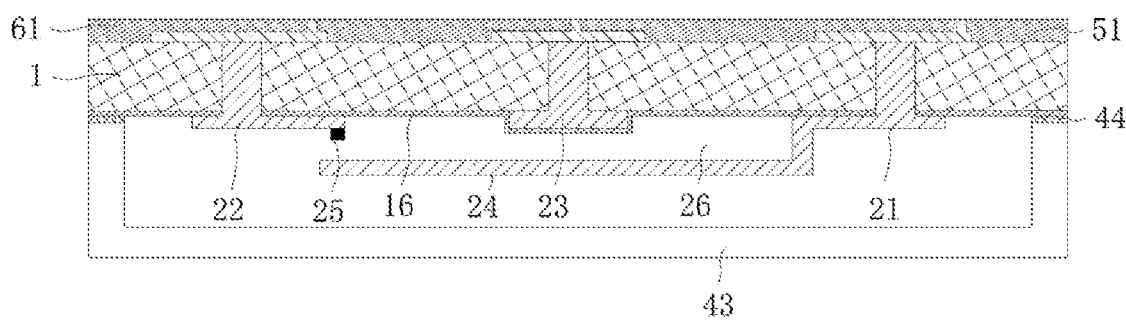
FIG. 18 is a schematic diagram of a structure formed in Step S25 in the packaging method according to an embodiment of the present disclosure.
Figure 19:
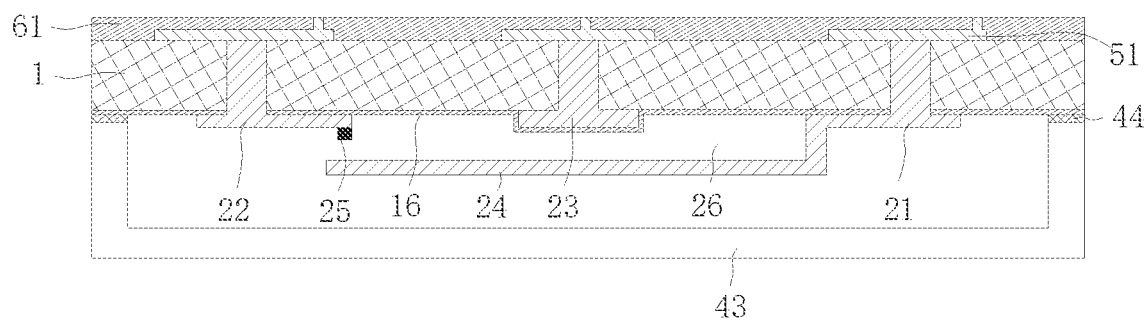
FIG. 19 is a schematic diagram of a structure formed in Step S26 in the packaging method according to an embodiment of the present disclosure.

Step S25 includes fabricating a first wiring layer on the second surface of the substrate 1, as shown in FIG. 18.

After the MEMS switch is packaged, the device is turned over (the first surface and the second surface are upside down), and the packaged MEMS switch is used as a substrate for fabricating wiring layers and a filter thereon.

In some embodiments, the first wiring layer 51 is fabricated on the second surface of the substrate 1 to lead out the first signal electrode 21, the second signal electrode 22 and the driving electrode 23, that is, second terminals of the first conductive pillar 14a, the second conductive pillar 14b and the third conductive pillar 14c are electrically coupled to the corresponding conductive lines in the first wiring layer 51. The specific fabricating steps of the first wiring layer 51 include steps (1) to (3).

(1) The first wiring layer 51 is formed on the second surface of the substrate 1 by electroplating and wet etching processes.

The first wiring layer 51 is made of a material that includes at least one of gold, copper, silver, and aluminum. A thickness of the first wiring layer 51 is in a range of 3 µm to 10 µm.

(2) A height of the first wiring layer 51 is made uniform by Chemical Mechanical Polishing (CMP) process.

It should be noted that the corresponding conductive lines in the first wiring layer 51 are electrically coupled to the first signal electrode 21 and the second signal electrode 22 of the MEMS switch. When the MEMS switch is turned on, the signal may be transmitted to the filter through the first wiring layer 51.

(3) A first insulating layer 61 is fabricated, and the first insulating layer 61 covers the first wiring layer 51.

In some embodiments, the first insulating layer 61 is formed by spin-coating photoresist, exposure, and development processes.

The first insulating layer 61 is made of a material that includes silicide or organic material, the silicide includes silicon nitride, silicon oxide, etc., and the organic material includes polyimide, acrylic, etc.

Figure 20:
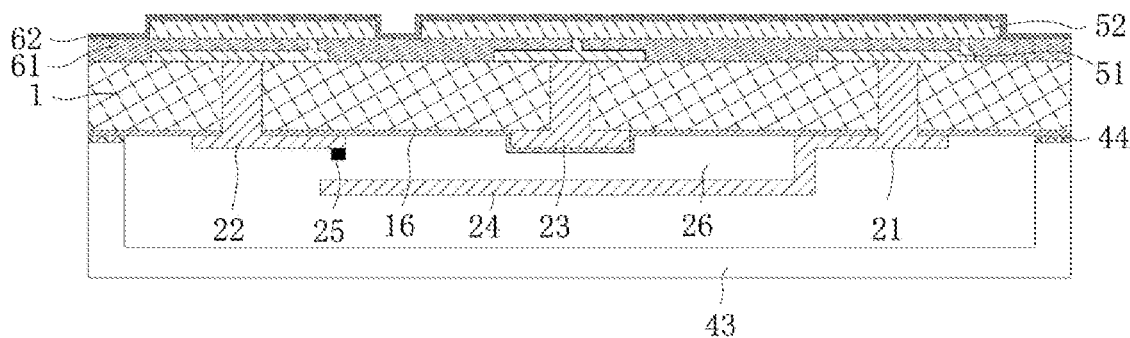
FIG. 20 is a schematic diagram of a structure formed in Step S27 in the packaging method according to an embodiment of the present disclosure.

Step S26 includes fabricating the second wiring layer 52, as shown in FIG. 20.

(1) A pattern of the second wiring layer 52 is obtained by spin-coating photoresist, exposure, and development processes.

It should be noted that spin-coating photoresist, exposure, and development processes may be performed by using related technologies, which are not limited in the embodiments of the present disclosure.

(2) The second wiring layer 52 is obtained within the pattern of the second wiring layer 52 by an electroplating process.

The second wiring layer 52 is made of a material that includes at least one of gold, copper, silver and aluminum, and a thickness of the second wiring layer 52 is in a range of 3 µm to 10 µm.

Step S27 includes fabricating a second insulating layer 62, as shown in FIG. 20.

In some embodiments, the second insulating layer 62 is formed on a second surface of the second wiring layer 62 by spin-coating photoresist, exposure, and development processes, the second insulating layer 62 covers the second surface of the second wiring layer 52, and the second insulating layer 62 can prevent the fabricated second wiring layer 52 and the devices from being oxidized by air.

The second insulating layer 62 is made of a material that includes at least one of silicon nitride and silicon oxide, and a thickness of the second insulating layer 62 is 25 µm.

Figure 21:
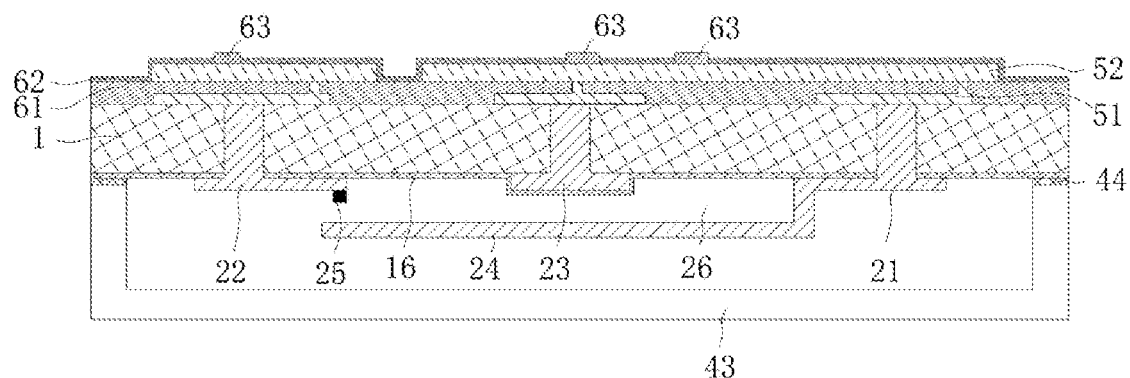
FIG. 21 is a schematic diagram of a structure formed in Step S28 in the packaging method according to an embodiment of the present disclosure.

Step S28 includes fabricating a third insulating layer 63, as shown in FIG. 21.

In some embodiments, the third insulating layer 63 is formed on a surface of the second wiring layer 62 away from the substrate 1 by spin-coating photoresist, exposure, and development processes, and the third insulating layer 63 is made of a material that includes at least one of silicon nitride and silicon oxide, and a thickness of the third insulating layer is in a range of 0.1 µm to 0.5 µm.

It should be noted that the third insulating layer 63 is a dielectric layer of a capacitor, that is, the third insulating layer 63 is a part of a structure of a capacitor in the filter.

Figure 22:
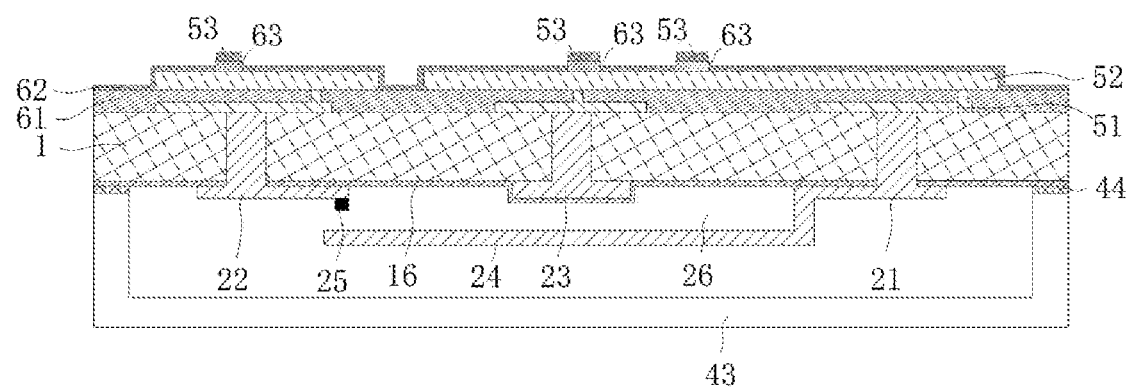
FIG. 22 is a schematic diagram of a structure formed in Step S29 in the packaging method according to an embodiment of the present disclosure.

Step S29 includes fabricating a third wiring layer 63, as shown in FIG. 22.

Patterns required by the third wiring layer 63 are formed on a surface of the third insulating layer 63 and on the side of the third insulating layer 63 away from the substrate by spin-coating photoresist, exposure, and pattern etching processes, and then conductive lines in the third wiring layer 63 are fabricated by an electroplating process.

The third wiring layer 63 is made of a material that includes at least one of gold, copper, silver and aluminum, and a thickness of the third wiring layer 63 is in a range of 0.1 µm to 1.0 µm. In some embodiments, the thickness of the third wiring layer 63 is 0.2 µm.

It should be noted that the capacitor in the filter is fabricated in the second wiring layer 52, the third insulating layer 63, and the third wiring layer 53, and in order to prevent the third wiring layer 53 from contacting the second wiring layer 52 and other devices, an area of the third wiring layer 53 is smaller than that of the third insulating layer 63, that is, an area of a projection of the third wiring layer 53 on the substrate 1 is smaller than that of the third insulating layer 63 on the substrate 1.

Figure 23:
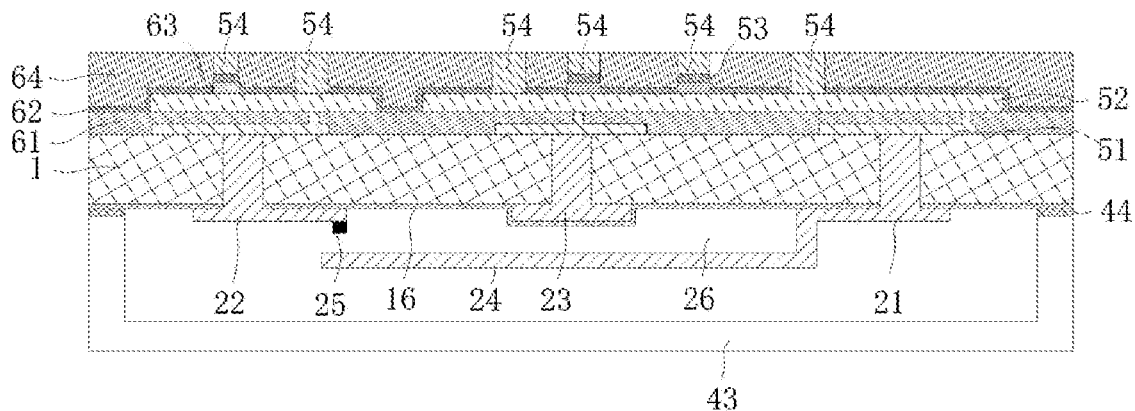
FIG. 23 is a schematic diagram of a structure formed in Step S30 in the packaging method according to an embodiment of the present disclosure.

Step S30 includes fabricating a fourth wiring layer 54 and a fourth insulating layer 64, as shown in FIG. 23.

In some embodiments, a pattern required for the fourth wiring layer 54 is obtained by spin-coating photoresist, exposure, and etching processes, and the fourth wiring layer 54 is obtained by an electroplating process. A plurality of wiring connections are provided in the fourth wiring layer 54, and electrically couple the corresponding conductive lines in the second wiring layer 52 to the corresponding conductive lines in the fifth wiring layer 55.

The fourth wiring layer 54 is made of a material that includes at least one of gold, copper, silver and aluminum, and a thickness of the fourth wiring layer 54 is in a range of 1 μm to 5 μm.

In some embodiments, the fourth insulating layer 64 is formed by spin-coating photoresist, exposure, and development processes, and the fourth insulating layer 64 is made of a material that includes at least one of silicon nitride and silicon oxide, and has a thickness in a range of 0.1 μm to 2 μm.

The fourth insulating layer 64 is used to isolate the third wiring layer 53 from the fifth wiring layer 55, so as to prevent the third wiring layer 53 and the fifth wiring layer 55 from being electrically coupled to each other in an unnecessary area, which affects the performance of the filter 3 and thus the performance of the electronic device.

Figure 24:
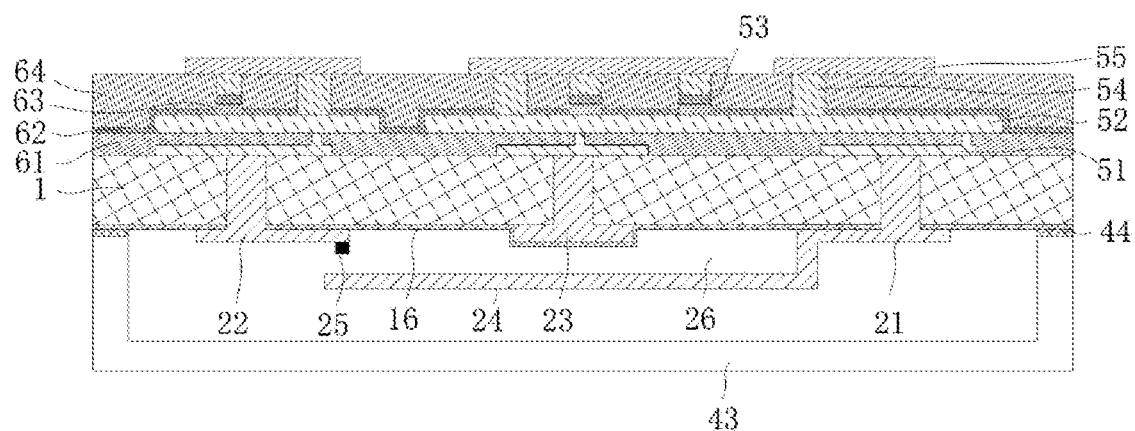
FIG. 24 is a schematic diagram of a structure formed in Step S31 in the packaging method according to an embodiment of the present disclosure.

Step S31 includes fabricating a fifth wiring layer 55, as shown in FIG. 24.

In some embodiments, a pattern required for the fifth wiring layer 55 is formed on a second surface of the fourth insulating layer 64 by spin-coating photoresist, exposure, and pattern etching processes, and then conductive lines in the fifth wiring layer 55 are fabricated by an electroplating process.

In some embodiments, the fifth wiring layer 55 is made of a material that includes at least one of gold, copper, silver, and aluminum, and a thickness of the fifth wiring layer 55 is in a range of 3 μm to 8 μm.

The fifth wiring layer 55 is configured to electrically couple the conductive balls to the filter.

Figure 25:
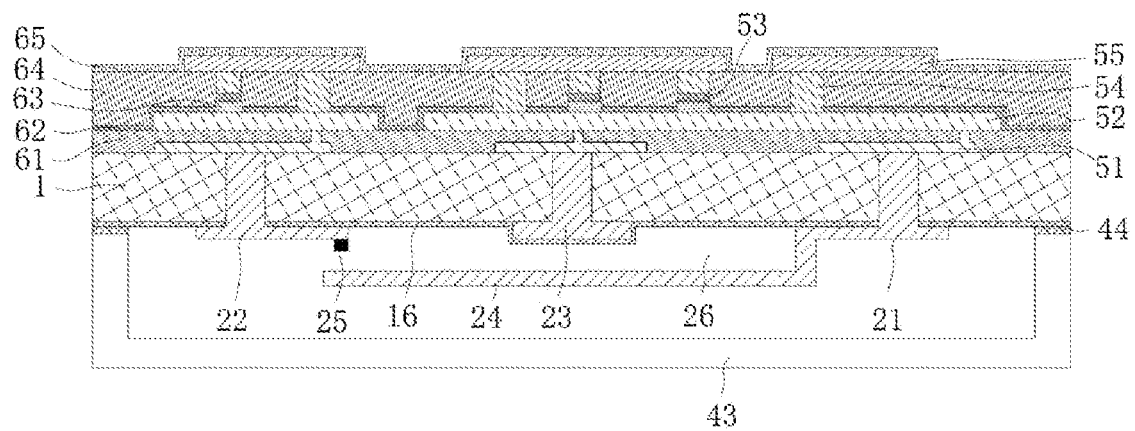
FIG. 25 is a schematic diagram of a structure formed in Step S32 in the packaging method according to an embodiment of the present disclosure.

Step S32 includes fabricating a fifth insulating layer 65, as shown in FIG. 25.

In some embodiments, the fifth insulating layer 65 is obtained by spin-coating photoresist, exposure, and development processes, and vias are formed in the fifth insulating layer 65, and the vias are configured to electrically couple the fifth wiring layer 55 to the conductive balls 8.

The fifth insulating layer 65 covers the fifth wiring layer 55, the fifth insulating layer 65 is made of a photosensitive material, for example, the fifth insulating layer 65 is made of a material that includes at least one of polyimide and photoresist, and a thickness of the fifth insulating layer 65 is in a range of 0.1 μm to 2 μm.

Figure 26:
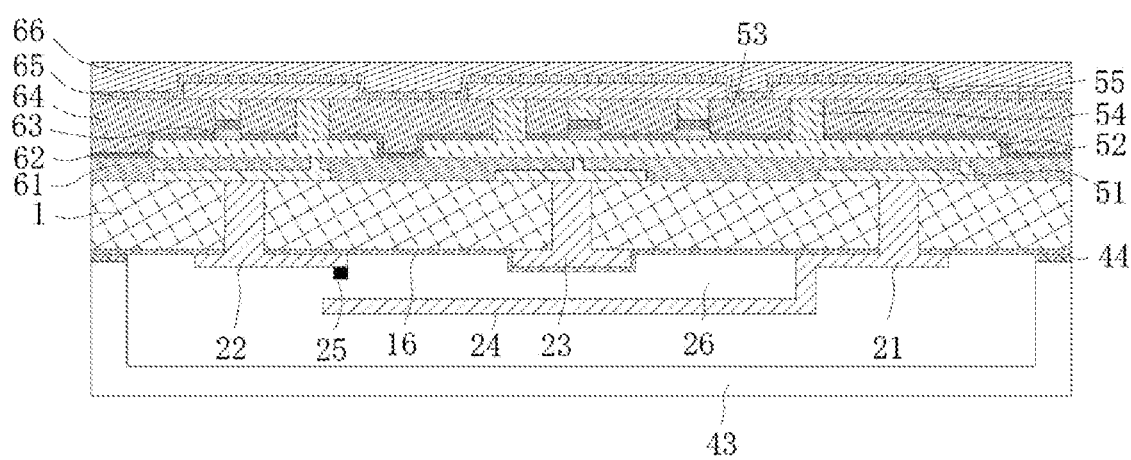
FIG. 26 is a schematic diagram of a structure formed in Step S33 in the packaging method according to an embodiment of the present disclosure.

Step S33 includes fabricating a sixth insulating layer 66, as shown in FIG. 26.

In some embodiments, the sixth insulating layer 66 is obtained by a spin-coating photoresist process, and the fifth insulating layer 65 and the sixth insulating layer 66 package the filter. Vias are formed in the sixth insulating layer 66 by exposure and development processes to electrically couple the fifth wiring layer 55 to the conductive balls 8.

The sixth insulating layer 66 covers the fifth insulating layer 65, the sixth insulating layer 66 is made of a photosensitive material, for example, the sixth insulating layer 66 is made of a material that includes at least one of polyimide and photoresist, and a thickness of the sixth insulating layer 66 is greater than or equal to 2 μm.

Step S34 includes fabricating a first conductive ball 8a, a second conductive ball 8b, and a third conductive ball 8c, as shown in FIG. 2.

A conductive material is filled in each via through a spot welding process, and a part of the conductive material extend out of the sixth insulating layer 66, and thereby the first conductive ball 8a, the second conductive ball 8b and the third conductive ball 8c may be formed, and the first conductive ball 8a, the second conductive ball 8b and the third conductive ball 8c are electrically coupled to corresponding conductive lines in the fifth wiring layer 55, so that the first signal electrode 21 of the MEMS switch is electrically coupled to the first conductive ball 8a, the output terminal of the filter 3 is electrically coupled to the second conductive ball 8b, and the driving electrode 23 is electrically coupled to the third conductive ball 8c.

In the embodiments of the present disclosure, the MEMS switch and the filter are integrally packaged by the TGV process, so that the integration of the process and the functional integration are realized, which has advantages to reduce the size of the electronic device, and the total cost of the MEMS switch and the filter. Moreover, the MEMS switch and the filter are integrated and interconnected, so that the wiring length between the MEMS switch and the filter is effectively shortened, the insertion loss and the signal distortion are reduced, which facilitates the signal transmission, and realize functional integration of the switch and the filter.

It should be noted that herein, the term "comprise", "include" or any other variation thereof, is intended to cover a non-exclusive inclusion, such that a process, method, article, or apparatus that includes a list of elements does not include only those elements but may include other elements not expressly listed or inherent to such process, method, article, or apparatus. Without further limitation, an element identified by the phrase "comprising . . . " does not exclude the presence of other identical elements in the process, method, article, or apparatus that includes the element.

It is to be understood that the above embodiments are merely exemplary embodiments adopted to illustrate the principles of the present disclosure/utility model, but the present disclosure/utility model is not limited thereto. It will be apparent to one of ordinary skill in the art that various modifications and improvements can be made without departing from the spirit and scope of the present disclosure/utility model, and such modifications and improvements are also considered to be within the scope of the present disclosure/utility model.

What is claimed is:

1. An electronic device, comprising:
a substrate having a first surface and a second surface opposite to each other in a thickness direction of the substrate, wherein the substrate has a first connection via and a second connection via which penetrate through the substrate in the thickness direction of the substrate, and a first conductive pillar and a second conductive pillar are respectively in the first connection via and the second connection via;
a switch on the first surface of the substrate and comprising a first signal electrode and a second signal electrode, wherein the first signal electrode is electrically coupled to a first terminal of the first conductive pillar, and the second signal electrode is electrically coupled to a first terminal of the second conductive pillar; and
a filter on the second surface of the substrate, wherein an input terminal of the filter is electrically coupled to a second terminal of the second conductive pillar, and an output terminal of the filter is electrically coupled to a second conductive ball of the electronic device, and a second terminal of the first conductive pillar is electrically coupled to a first conductive ball of the electronic device,
wherein the switch further comprises a cantilever,
a first terminal of the cantilever is electrically coupled to the first signal electrode; a second terminal of the cantilever is electrically coupled to the second signal electrode in response to an on state of the switch; and the second terminal of the cantilever is disconnected from the second signal electrode in response to an off state of the switch, and the electronic device further comprises a contact passivation layer on a first surface of the second signal electrode, wherein the contact passivation layer is below the cantilever; and the second terminal of the cantilever is in contact with the contact passivation layer in response to the on state of the switch.

2. The electronic device of claim 1, further comprising a package cover plate, wherein the package cover plate comprises a cover plate body and an accommodation space on the cover plate body, the package cover plate is on the first surface of the substrate, the accommodation space has an opening facing the substrate, and the switch is in the accommodation space.

3. The electronic device of claim 1, wherein the substrate is a glass substrate.

4. The electronic device of claim 1, further comprising an electrode layer on the first surface of the substrate, wherein the first signal electrode and the second signal electrode are in the electrode layer.

5. The electronic device of claim 4, wherein the substrate is a glass substrate.

6. The electronic device of claim 4, wherein the switch further comprises a driving electrode in the electrode layer, and the driving electrode is between the first signal electrode and the second signal electrode;

the substrate has a third connection via penetrating through the substrate along the thickness direction of the substrate, the third connection via is between the first connection via and the second connection via, a third conductive pillar is in the third connection via, a first terminal of the third conductive pillar is electrically coupled to the driving electrode, and a second terminal of the third conductive pillar is electrically coupled to a third conductive ball of the electronic device.

7. The electronic device of claim 6, wherein the first conductive ball, the second conductive ball, and the third conductive ball are coupled to an external device.

8. The electronic device of claim 6, wherein the substrate is a glass substrate.

9. The electronic device of claim 6, further comprising an insulating dielectric layer on a first surface of the driving electrode.

10. The electronic device of claim 9, wherein the substrate is a glass substrate.

11. The electronic device of claim 4, further comprising a first wiring layer on the second surface of the substrate, a first insulating layer on a surface of the first wiring layer away from the substrate, a second wiring layer on a surface of the first insulating layer away from the substrate, a third insulating layer on a surface of the second wiring layer away from the substrate, and a third wiring layer on a surface of the third insulating layer away from the substrate; and the filter comprises a capacitor, wherein a first plate of the capacitor is in the second wiring layer and is electrically coupled to a corresponding conductive line in the first wiring layer, a second plate of the capacitor is in the third wiring layer, and a dielectric layer of the capacitor is in the third insulating layer.

12. The electronic device of claim 11, wherein a surface area of the second plate of the capacitor is less than a surface area of the third insulating layer.

13. The electronic device of claim 11, further comprising a second insulating layer covering a second surface of the second wiring layer.

14. The electronic device of claim 13, further comprising a fourth wiring layer on a second surface of the second insulating layer, wherein the second plate of the capacitor is electrically coupled to a corresponding conductive line in the fourth wiring layer.

15. The electronic device of claim 14, further comprising a fourth insulating layer and a fifth wiring layer, wherein the fourth insulating layer is between the third wiring layer and the fifth wiring layer, conductive lines in the third wiring layer are electrically coupled to corresponding conductive lines in the fifth wiring layer, and conductive lines in the fourth wiring layer are electrically coupled to corresponding conductive lines in the fifth wiring layer.

16. The electronic device of claim 15, further comprising a fifth insulating layer and a sixth insulating layer on a second surface of the fifth wiring layer, wherein the sixth insulating layer is on a side of the fifth insulating layer away from the substrate; and vias penetrating through the fifth insulating layer and the sixth insulating layer in a thickness direction of the fifth insulating layer and the sixth insulating layer, wherein the vias are at positions corresponding to conductive lines in the fifth wiring layer, and conductive balls electrically coupled to an external device are in the vias and electrically coupled to the conductive lines in the fifth wiring layer.

17. A method of fabricating an electronic device, comprising:

providing a substrate, wherein the substrate has a first surface and a second surface opposite to each other in a thickness direction of the substrate, and the substrate has a first connection via and a second connection via which penetrate through the substrate in the thickness direction of the substrate;

filling the first connection via and the second connection via with a conductive material, to obtain a first conductive pillar and a second conductive pillar respectively;

fabricating a switch on the first surface of the substrate, wherein a first signal electrode of the switch is electrically coupled to a first terminal of the first conductive pillar, and a second signal electrode of the switch is electrically coupled to a first terminal of the second conductive pillar; and fabricating a filter on the second surface of the substrate, wherein an input terminal of the filter is electrically coupled to a second terminal of the second conductive pillar, and an output terminal of the filter is electrically coupled to a second conductive ball of the electronic device, and a second terminal of the first conductive pillar is electrically coupled to a first conductive ball of the electronic device, wherein the switch further comprises a cantilever, a first terminal of the cantilever is electrically coupled to the first signal electrode; a second terminal of the cantilever is electrically coupled to the second signal electrode in response to an on state of the switch; and the second terminal of the cantilever is disconnected from the second signal electrode in response to an off state of the switch, and the electronic device further comprises a contact passivation layer on a first surface of the second signal electrode, wherein the contact passivation layer is below the cantilever; and the second terminal of the cantilever is in contact with the contact passivation layer in response to the on state of the switch.

18. The method of claim 17, wherein the first connection via and the second connection via are formed by a through glass via (TGV) process.

\* \* \* \* \*